(12) United States Patent
Fober et al.

(10) Patent No.: US 8,759,800 B2
(45) Date of Patent: Jun. 24, 2014

(54) HIGH-VOLTAGE SUPPLY UNIT FOR A PARTICLE BEAM DEVICE

(75) Inventors: Joerg Fober, Heuchlingen (DE); Martin Hugelmann, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/523,169

(22) Filed: Jun. 14, 2012

(65) Prior Publication Data

US 2012/0318975 A1 Dec. 20, 2012

(30) Foreign Application Priority Data

Jun. 16, 2011 (DE) .......................... 10 2011 077 635

(51) Int. Cl.
*G01R 19/00* (2006.01)
*G01R 31/26* (2014.01)
*G01R 31/305* (2006.01)

(52) U.S. Cl.
USPC ....... 250/492.3; 324/713; 324/658; 324/71.3; 324/71.4; 324/754.22

(58) Field of Classification Search
USPC .......................................... 250/492.1, 396 R
See application file for complete search history.

(56) References Cited

U.S. PATENT DOCUMENTS

| | | | | | |
|---|---|---|---|---|---|
| 3,280,246 | A | * | 10/1966 | Lawson et al. | 174/88 C |
| 3,484,679 | A | * | 12/1969 | Hodgson et al. | 323/208 |
| 4,020,318 | A | * | 4/1977 | Sanderson | 219/121.27 |
| 4,241,259 | A | * | 12/1980 | Feuerbaum et al. | 250/441.11 |
| 4,281,360 | A | * | 7/1981 | Brehse | 361/303 |
| 4,306,272 | A | * | 12/1981 | Little | 361/303 |
| 7,235,784 | B2 | * | 6/2007 | Taniguchi et al. | 250/311 |
| 7,375,329 | B2 | * | 5/2008 | Fujita et al. | 250/310 |
| 7,718,976 | B2 | * | 5/2010 | Kawasaki et al. | 250/396 R |
| 2002/0053638 | A1 | * | 5/2002 | Winkler et al. | 250/306 |
| 2008/0122461 | A1 | | 5/2008 | Ernest et al. | |
| 2010/0296320 | A1 | | 11/2010 | Fober | |

FOREIGN PATENT DOCUMENTS

DE 44 36 305 A1 4/1996
DE 10 2010 002 617 A1 9/2010

OTHER PUBLICATIONS

G. G. Wolzak, et al., "Capacitive measurement of high dc voltages", Rev. Sci. Instrum. 52 (1981) 1572-1574.

* cited by examiner

*Primary Examiner* — Jack Berman
*Assistant Examiner* — Sean Luck
(74) *Attorney, Agent, or Firm* — Muirhead and Saturnelli, LLC (57) ABSTRACT

A high-voltage supply unit is provided for a particle beam device. The high-voltage supply unit includes at least one high-voltage cable for feeding a high voltage, and at least one measuring device for measuring the high voltage. The measuring device has at least one first capacitor, and the first capacitor is formed by at least one first section of the high-voltage cable.

22 Claims, 9 Drawing Sheets

HIGH-VOLTAGE SUPPLY UNIT FOR A PARTICLE BEAM DEVICE

TECHNICAL FIELD

This application relates to a high-voltage supply unit for a particle beam device, and to a particle beam device comprising a high-voltage supply unit of this type.

BACKGROUND OF THE INVENTION

Electron beam devices, more particularly a scanning electron microscope (SEM) or a transmission electron microscope (TEM) are used for examining objects in order to obtain knowledge regarding the properties and behavior of said objects under specific conditions.

Both in the case of an SEM and in the case of a TEM, electrons are generated using a beam generator. The electrons emerge from the beam generator and form an electron beam. They are accelerated to a potential on account of a potential difference between the beam generator and an anode. For this purpose, the beam generator is usually supplied with a negative high voltage. In the case of an SEM, said voltage is, for example, in the range of (−1) kV to (−30) kV relative to the ground potential. In the case of a TEM, the high voltage is, for example, in the range of (−10) kV to (−300) kV relative to the ground potential.

In order to achieve examination of an object with a high resolution in the case of the particle beam devices mentioned above, it is desirable for the high voltage made available by a high-voltage supply unit not to be subject to large fluctuations. In order to initiate corresponding measures for stabilizing the high voltage, it is known to measure fluctuations of the high voltage. By way of example, a measuring device having a resistive voltage divider or a capacitive voltage divider is used. The capacitive voltage divider comprises a first capacitor in the form of a high-voltage capacitor and a second capacitor in the form of a measuring capacitor. The first capacitor is accommodated in a housing and sheathed with a high-voltage shield. The housing and the high-voltage shield have a high weight, however, such that the measuring device provided with the capacitive voltage divider is very heavy. By way of example, the weight of a known measuring device designed for 200 kV is several hundred kilograms. Such a high weight makes the handling and the installation of the known measuring device very complicated. In particular, transporting the measuring device to a particle beam device is laborious. Subsequent installation of the known measuring device is therefore possible only with relatively high outlay.

Furthermore, the high-voltage capacitor used in the known measuring device is expensive to procure.

Accordingly, it would be desirable to provide a high-voltage supply unit comprising a measuring device for measuring fluctuations of a high voltage which is cost-effective and simple to handle.

SUMMARY OF THE INVENTION

According to the system described herein, a high-voltage supply unit is provided for a particle beam device. The high-voltage supply unit may have at least one high-voltage cable for feeding a high voltage. Furthermore, the high-voltage supply unit may be provided with at least one measuring device for measuring the high voltage. The measuring device may have at least one first capacitor. The first capacitor may be embodied, for example, as a high-voltage capacitor. Furthermore, the first capacitor may be formed by at least one first section of the high-voltage cable.

The system described herein is based on the surprising insight that the high-voltage cable of the high-voltage supply unit can be used as a capacitor. The high-voltage cable itself, as an electrical line, has a characteristic variable, namely a capacitance per unit length. This characteristic variable describes the capacitance of the high-voltage cable per unit length. Given a suitable choice of the length of the abovementioned first section of the high-voltage cable, the first capacitor has a capacitance that suffices for measuring the high voltage.

The system described herein firstly has the advantage that the measuring device is cost-effective to produce on account of the simple production of the first capacitor. Secondly, the measuring device is light in comparison with the prior art. Transport and installation of the high-voltage supply unit are therefore simple. Moreover, considerations have revealed that the first capacitor formed in this way has only little influence on the high voltage to be measured, such that measurements of the high voltage are possible with a high accuracy.

One embodiment of the high-voltage supply unit according to the system described herein additionally or alternative provides for the high-voltage cable to have the following construction. The high-voltage cable has at least one internal conductor surrounded by at least one first insulation. The first insulation is in turn surrounded by at least one first shield. The high-voltage cable described above is, for example, a high-voltage cable having a conductive outer surface. The first shield is interrupted in at least one first region and/or in at least one second region of the first section of the high-voltage cable. Furthermore, provision is made for the first section of the high-voltage cable to be surrounded by a second shield. Both the first shield and the second shield serve to protect persons working with the high-voltage supply unit according to the system described herein.

A further embodiment of the high-voltage supply unit according to the system described herein additionally or alternatively provides for the first section of the high-voltage cable to extend along a longitudinal axis of the high-voltage cable and furthermore to have a first longitudinal extent. Furthermore, provision is made for the first region to extend along the longitudinal axis of the high-voltage cable with a second longitudinal extent, wherein the second longitudinal extent of the first region is less than the first longitudinal extent of the first section of the high-voltage cable. In addition or as an alternative thereto, provision is made for the second region to extend along the longitudinal axis of the high-voltage cable with a third longitudinal extent, wherein the third longitudinal extent of the second region is less than the first longitudinal extent of the first section of the high-voltage cable.

A further embodiment of the high-voltage supply unit according to the system described herein additionally or alternatively provides for the internal conductor to be surrounded by at least one second insulation. This is provided, in particular, when the high-voltage cable has at least two internal conductors. The second insulation is surrounded by at least one third shield. This embodiment concerns, for example, a high-voltage cable having a plurality of insulated and shielded internal conductors (namely through the second insulation and through the third shield) surrounded by a further insulation (namely the first insulation), which is in turn shielded (namely by the first shield). A further embodiment provides for two or more internal conductors each to be surrounded by a second insulation and for these two or more internal conductors then to be surrounded by a common third shield.

In a next embodiment of the high-voltage supply unit according to the system described herein, the high-voltage supply unit has at least one of the following features:
the first shield is surrounded by at least one first sheathing, or
in the first section of the high-voltage cable the second shield is surrounded by at least one second sheathing.

By way of example, at least one of the first sheathing and the second sheathing is formed from rubber and/or a plastic.

A further embodiment of the high-voltage supply unit according to the system described herein additionally or alternatively provides for the first shield to be at ground potential. However, the first shield is not at ground potential in the first section of the high-voltage cable. However, provision is additionally or alternatively made for the second shield to be at ground potential.

Yet another embodiment of the high-voltage supply unit according to the system described herein additionally or alternatively provides:
for the high-voltage cable to have a capacitance per unit length in the range of 10 pF/m to 1000 pF/m, or
for the high-voltage cable to have a capacitance per unit length in the range of 50 pF/m to 500 pF/m, or
for the high-voltage cable to have a capacitance per unit length in the range of 80 pF/m to 250 pF/m.

It is expressly pointed out that the system described herein is not restricted to the values mentioned above. Rather, any suitable value of a capacitance per unit length can be chosen.

A further embodiment of the high-voltage supply unit according to the system described herein additionally or alternatively provides for the measuring device to have at least one capacitive voltage divider, wherein the capacitive voltage divider comprises the first capacitor and at least one second capacitor. As an alternative thereto, provision is made, for example, for the measuring device to have at least one measuring resistor for measuring the high voltage. By way of example, the measuring resistor is arranged in a voltage measuring unit. The measuring resistor can therefore directly be a part of a voltage measuring unit.

Yet another embodiment of the high-voltage supply unit according to the system described herein additionally or alternatively provides for the high-voltage cable to comprise at least one second section. The first section is arranged at a distance from the second section. By way of example, provision is made for the second section to be embodied identically to the first section. These exemplary embodiments provide, for example, for a plurality of first capacitors to be formed on the high-voltage cable. Both the first section and the second section form a first capacitor in each case.

The system described herein also relates to a use of a high-voltage supply unit comprising at least one of the abovementioned features or comprising at least two of the abovementioned features for measuring fluctuations of a high voltage and/or for generating a measurement signal used for regulating the high-voltage supply unit.

The system described herein furthermore relates to a particle beam device that may include at least one beam generator for generating a particle beam, at least one objective lens for focusing the particle beam onto at least one object, and at least one high-voltage supply unit, wherein the high-voltage supply unit may have at least one of the abovementioned features or at least two of the abovementioned features.

An embodiment of the particle beam device according to the system described herein additionally or alternatively provides for the high-voltage supply unit to be designed to supply an electron source or an electrode, for example an extraction electrode or an anode, with high voltage. In addition or as an alternative thereto, provision is made for the high-voltage supply unit to be designed to supply further components of the particle beam device, for example at least one electrode of a corrector or a spectrometer. Furthermore, the particle beam device is embodied, for example, as an electron beam device or as an ion beam device.

BRIEF DESCRIPTION OF THE DRAWINGS

Embodiments of the system described herein are explained in greater detail below on the basis of the figures, in which.

DETAILED DESCRIPTION OF VARIOUS EMBODIMENTS

The system described herein is described below on the basis of a particle beam device in the form of a transmission electron microscope (designated by TEM hereinafter) and a scanning electron microscope (designated by SEM hereinafter). However, at this juncture already it is pointed out that the system described herein is not restricted to a TEM or an SEM. Rather, the system described herein can be used in any particle beam device, for example also in an ion beam device.

Figure 1:
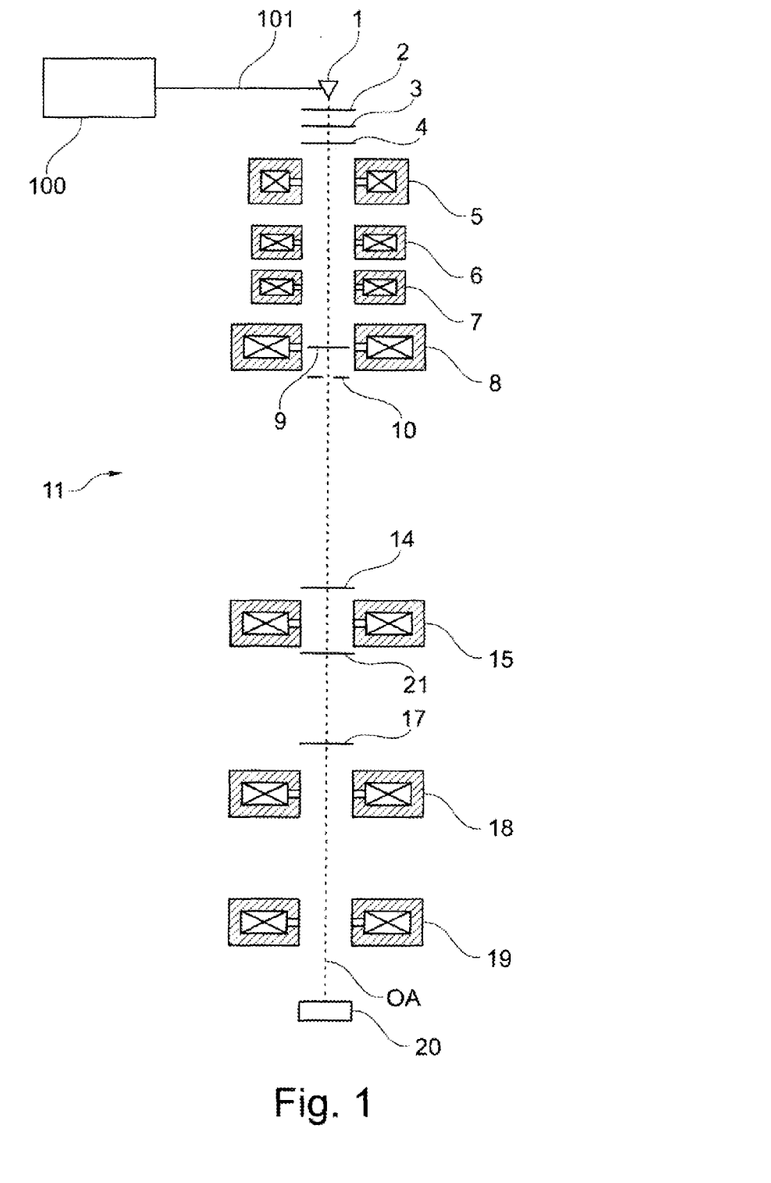
FIG. 1 shows a schematic illustration of a particle beam device according to an embodiment of the system described herein in the form of a transmission electron microscope.

FIG. 1 shows a schematic illustration of a TEM 11. The TEM 11 has an electron source 1 in the form of a thermal field emission source. However, some other electron source can indeed be used as well. Along the optical axis OA of the TEM 11, an extraction electrode 2 is arranged downstream of the electron source 1, electrons being extracted from the electron source 1 by virtue of the potential of said electrode. Furthermore, a first electrode 3 for focusing the source position and a second electrode 4 for accelerating the electrons are provided. On account of the second electrode 4, the electrons emerging from the electron source 1 are accelerated to a desired and adjustable energy using an electrode voltage. For this purpose, the electron source 1 is connected to a high-voltage supply unit 100 via a high-voltage cable 101. This will be discussed in even greater detail further below.

In the further course on the optical axis OA, a multistage condenser is arranged which has three magnetic lenses 5 to 7 (namely a first magnetic lens 5, a second magnetic lens 6 and a third magnetic lens 7), said condenser being followed by an objective 8 provided in the form of a magnetic lens. An object plane 9 is arranged at the objective 8, at which object plane an object to be examined can be arranged using a sample manipulator. Through corresponding setting of the operating parameters (for example of a lens current) of the first magnetic lens 5, of the second magnetic lens 6, of the third magnetic lens 7 and of the objective 8, in particular the illuminated field of the object plane 9 can be set.

A diffraction lens 15 embodied as a magnetic lens is disposed downstream of the objective 8 in the opposite direction to the electron source 1. The diffraction lens 15 firstly images a back focal plane 10 of the objective 8 into a diffraction intermediate image plane 21. Furthermore, the objective 8 generates a real intermediate image 14 of the object plane 9. The diffraction lens 15 secondly images the intermediate image 14 of the object plane 9 into the entrance image plane 17 of a projection system consisting of a first projection lens 18 and a second projection lens 19. The projection system 18, 19 then generates, from the object arranged in the object plane 9 and imaged into the entrance image plane 17 of the projection system 18, 19, an image on a detector 20. By correspondingly switching over the projection system 18, 19, it is also possible to image the back focal plane 10 or the diffraction intermediate image plane 21 onto the detector 20 (or into an end image plane). A TEM 11 of this type can have further lenses and deflection and correction systems (for example stigmators or correctors) and/or spectrometers.

Figure 2:
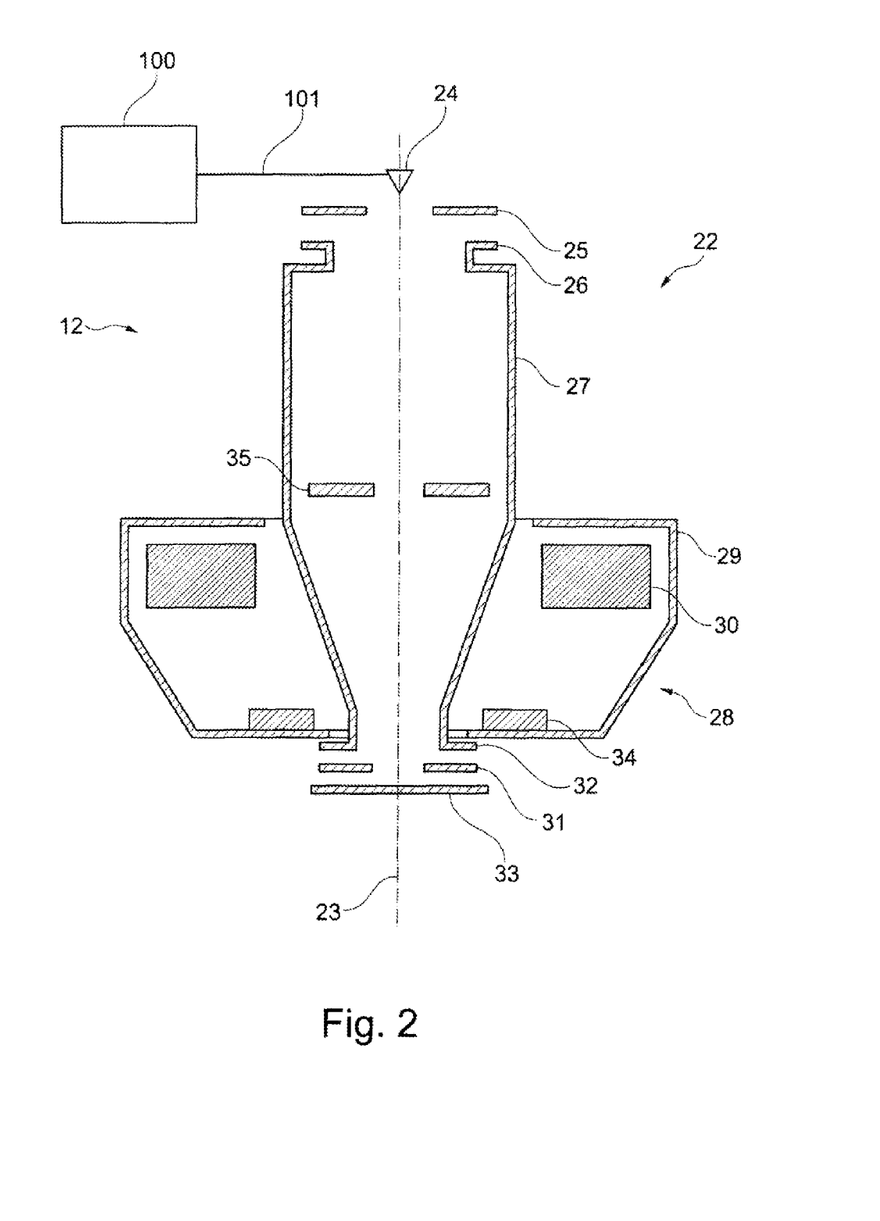
FIG. 2 shows a schematic illustration of a particle beam device according to an embodiment of the system described herein in the form of a scanning electron microscope.

FIG. 2 shows a further particle beam device in the form of an SEM 12, on which the system described herein is realized. The particle beam device has an electron column 22, which is provided with an optical axis 23, a beam generator in the form of an electron source 24 (cathode), an extraction electrode 25 and an anode 26, which simultaneously forms one end of a beam guiding tube 27. By way of example, the electron source 24 is a thermal field emitter. Electrons that emerge from the electron source 24 are accelerated to anode potential on account of a potential difference between the electron source 24 and the anode 26. Accordingly, a particle beam in the form of an electron beam is provided. In this exemplary embodiment, too, the electron source 24 is connected to a high-voltage supply unit 100 via a high-voltage cable 101.

Furthermore, an objective lens 28 is provided, which has a hole through which the beam guiding tube 27 passes. The objective lens 28 furthermore has pole shoes 29, in which coils are arranged. An electrostatic delay device is connected downstream of the beam guiding tube 27. Said device consists of an individual electrode 31 and a tube electrode 32. The tube electrode 32 lies at that end of the beam guiding tube 27 which lies opposite a carrier element 33. The carrier element 33 serves for accommodating an object to be examined.

The tube electrode 32 together with the beam guiding tube 27 is at anode potential, while the individual electrode 31 and an object arranged on the carrier element 33 are at a potential lower than the anode potential. In this way, the electrons of the particle beam can be decelerated to a desired energy required for the examination of an object arranged on the carrier element 33. The electron column 22 additionally has a scanning device 34, by which the electron beam can be deflected and scanned over an object arranged on the carrier element 33.

For imaging purposes, secondary electrons and/or backscattered electrons which arise on account of the interaction of the electron beam with an object arranged on the carrier element 33 are detected using a detector 35 arranged in the beam guiding tube 27. The signals generated by the detector 35 are communicated to an electronic unit (not illustrated) for imaging purposes.

Figure 3:
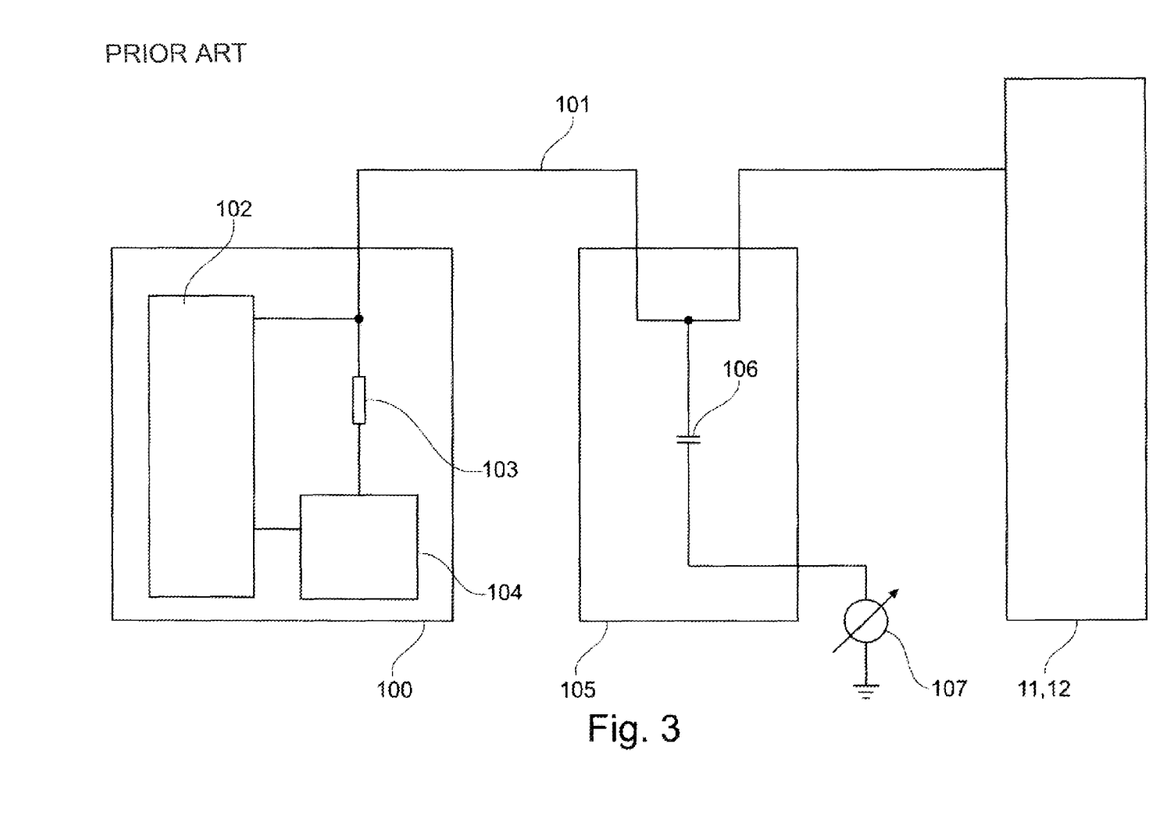
FIG. 3 shows a schematic illustration of a high-voltage supply unit with measuring device according to the prior art.

FIG. 3 shows a schematic illustration of the prior art which has been used heretofore for measuring the high voltage in the TEM 11 and/or the SEM 12. The high-voltage supply unit 100 is connected to the TEM 11 or the SEM 12 via the high-voltage cable 101. It has a high-voltage generator 102, a high-voltage regulator 104 and a resistor 103 for the high-voltage regulator 104. The high-voltage regulator 104 and the resistor 103 serve for regulating the high voltage made available by the high-voltage supply unit 100. In this case, by way of example, in the high-voltage regulator 104, a reference signal is compared with the actual signal obtained via the resistor 103 and the high-voltage regulator 104 sets the high-voltage generator 102 in such a way that the actual signal corresponds to the reference signal. In order to measure the high voltage, a measuring device 105 is provided, which has a high-voltage capacitor 106. The latter is connected to a measuring unit 107 via a tap. The measuring device 105 with the high-voltage capacitor 106 can alternatively be directly integrated in the high-voltage supply unit 100 and then does not require a separate housing in this case.

The measuring unit 107 indicates the fluctuations of the high voltage made available by the high-voltage supply unit 100. In this case, fluctuations are understood to mean, for example, oscillations in the range of from approximately $\frac{1}{10}$ Hz to many 100 kHz (that is to say slow fluctuations (approximately $\frac{1}{10}$ Hz) to very high-frequency fluctuations (greater than 100 kHz)). This measurement signal of the measuring unit 107 can be utilized for assessing the stability of the high-voltage supply unit 100. Additionally or alternatively, it is also possible to utilize this measurement signal for stabilizing the regulation of the high-voltage supply unit 100.

Figure 4:
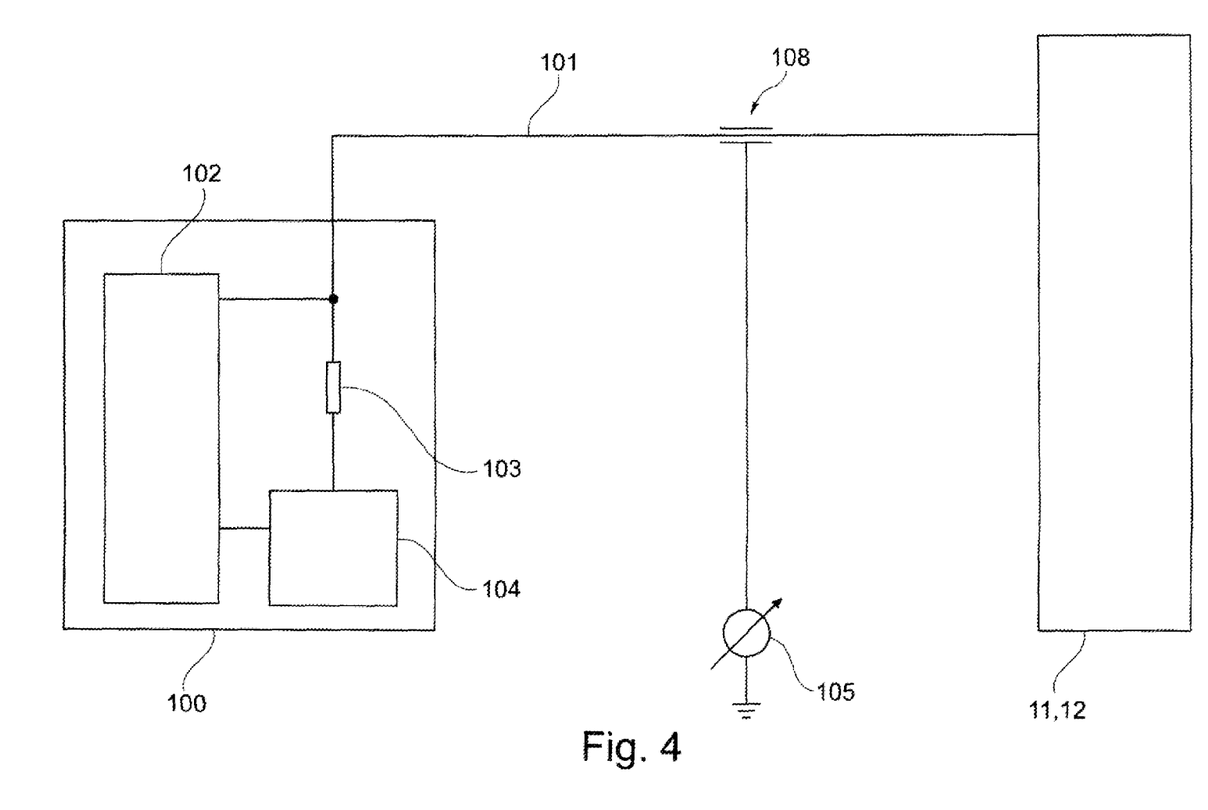
FIG. 4 shows a schematic illustration of a high-voltage supply unit with measuring device according to an embodiment of the system described herein.

FIG. 4 shows a schematic illustration of a high-voltage supply unit 100 according to the system described herein. FIG. 4 is based on FIG. 3. Identical components are therefore provided with identical reference signs. In contrast to the prior art, the system described herein now provides for the high-voltage cable 101 to have a first section 108, which is embodied as a high-voltage capacitor.

Figure 5:
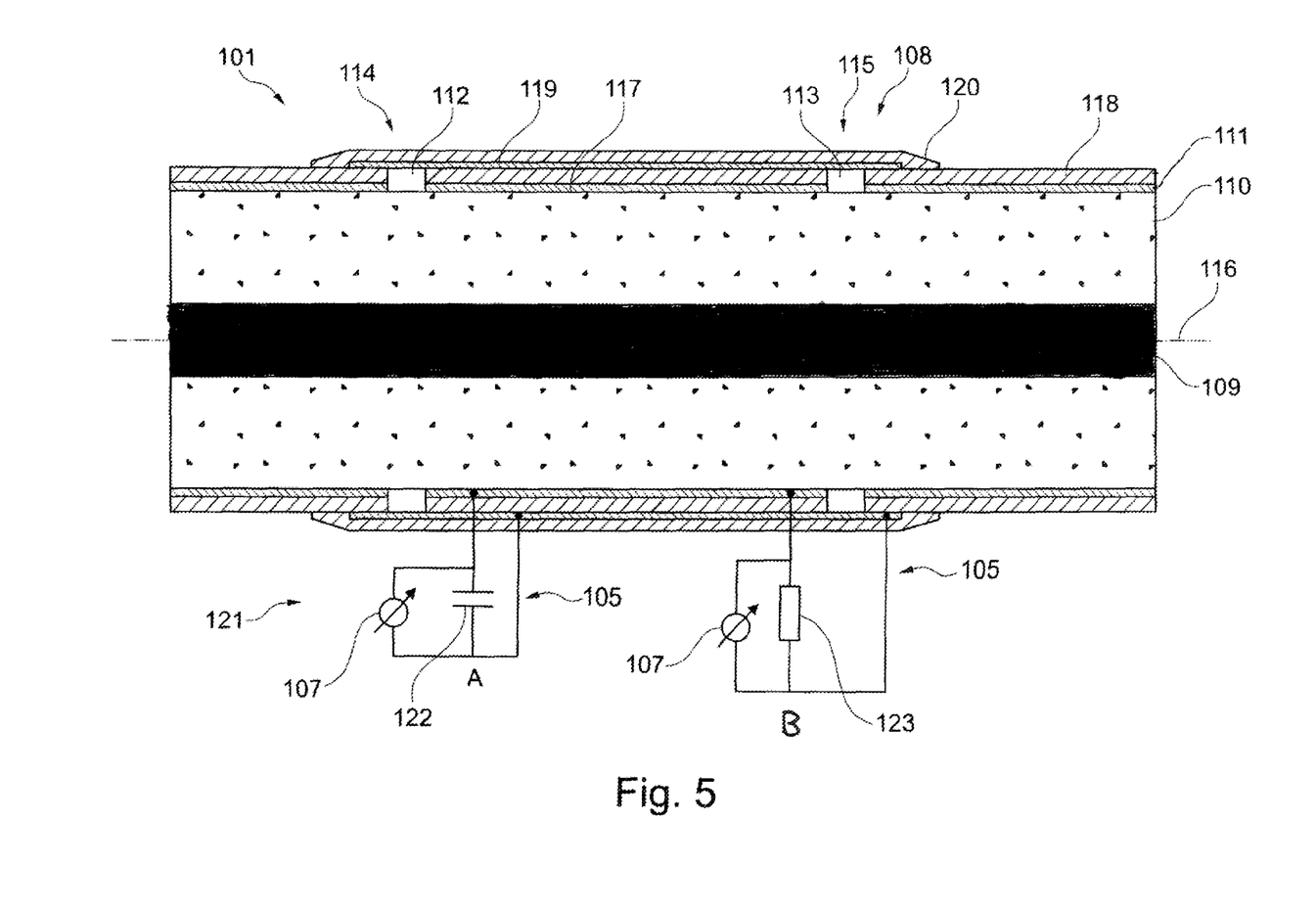
FIG. 5 shows a schematic illustration of a first embodiment of a high-voltage cable embodied as a capacitor.

FIG. 5 shows a schematic illustration of a first embodiment of the high-voltage cable 101, which is constructed symmetrically with respect to a longitudinal axis 116. The high-voltage cable 101 has an internal conductor 109, which is surrounded by a first insulation 110. The first insulation 110 is in turn surrounded by a first shield 111. The high-voltage cable 101 now has the first section 108, which forms the first capacitor.

The first section 108 of the high-voltage cable 101 has a first end 114 and a second end 115. A first region 112 is arranged at the first end 114. By contrast, a second region 113 is arranged at the second end 115. The first shield 111 is separated both in the first region 112 and in the second region 113. To put it another way, the first shield 111 is interrupted in the first region 112 and in the second region 113. That part 117 of the first shield 111 which is arranged between the first region 112 and the second region 113 forms an electrode of the first section 108 embodied as a first capacitor.

The first shield 111 is surrounded by a first sheathing 118 over the entire length of the high-voltage cable 101. However, here as well provision is made for the first sheathing 118 to be separated both in the first region 112 and in the second region 113. In the first section 108, a second sheathing 119 is arranged on the first sheathing 118, said second shield extending along the longitudinal axis 116 both across the first region 112 and across the second region 113. The second shield 119 is in turn surrounded with a second sheathing 120. Both the first shield 111 and the second shield 119 are at ground potential and serve to protect persons working with the high-voltage supply unit 100.

It is explicitly pointed out that the first sheathing 118 and/or the second sheathing 120 are not absolutely necessary for the system described herein. Some embodiments do not have at least one of the two sheathings mentioned above.

The high-voltage cable 101 can have in the first section 108, for example, a capacitance per unit length in the range of 10 pF/m to 1000 pF/m, or in the range of 50 pF/m to 500 pF/m, or in the range of 80 pF/m to 250 pF/m.

FIG. 5 also shows two possible types of voltage measurement in a schematic illustration. In a first measurement type A, the measuring device 105 has a capacitive voltage divider 121. The capacitive voltage divider 121 has the first section 108 embodied as a first capacitor (high-voltage capacitor), and a second capacitor 122 (low-voltage capacitor). The voltage dropped across the second capacitor 122 is measured by the measuring unit 107. In a second measurement type B, a measuring resistor 123 is provided in the measuring device 105, the voltage dropped across said resistor being measured using the measuring unit 107. Additionally or alternatively, the measuring resistor 123 can be a part of the measuring unit 107; to put it another way, the internal resistance of the measuring unit 107 can directly be the measuring resistor 123.

Figure 6:
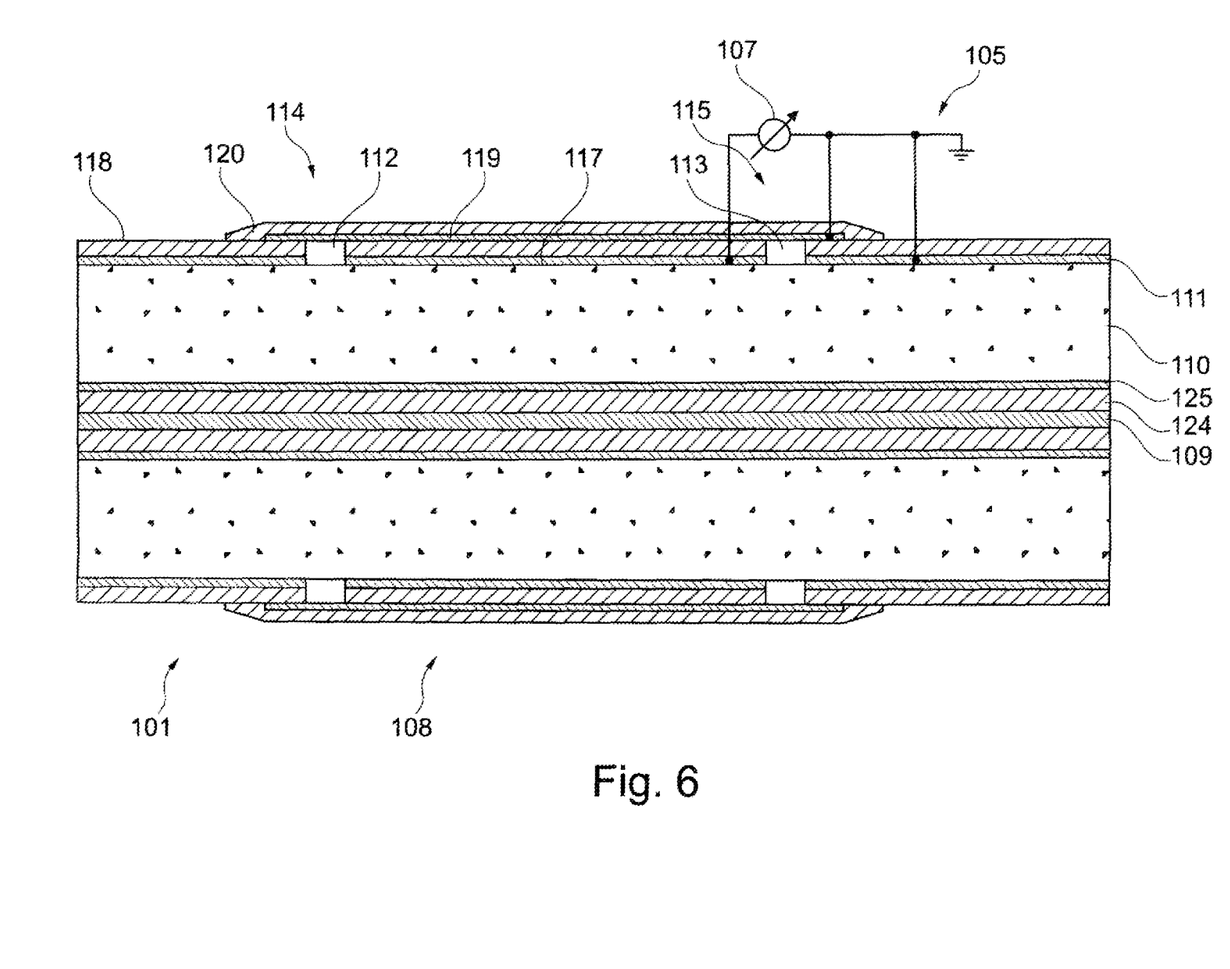
FIG. 6 shows a schematic illustration of a second embodiment of a high-voltage cable embodied as a capacitor.

FIG. 6 shows a further embodiment of the high-voltage cable 101. FIG. 6 is based on FIG. 5. Identical components are provided with identical reference signs. In contrast to the exemplary embodiment in FIG. 5, the embodiment in FIG. 6 has a second insulation 124 surrounding the internal conductor 109. Alternatively, a plurality of internal conductors 109 are provided in the high-voltage cable 101. A third shield 125 is arranged around the second insulation 124. In a further exemplary embodiment, a plurality of internal conductors 109 can be provided, wherein each of the individual internal conductors 109 is surrounded in each case by a second insulation 124. Alternatively, provision is made for all of the internal conductors 109 to be surrounded by a common third shield 125. The high voltage at the measuring unit 107 is measured using the measuring device 105. In addition, provision can be made of a protective circuit (not illustrated) as overvoltage protection of the measuring device 105 in the case of voltage flashovers. For this purpose, a diode protective circuit is used, for example, which can additionally also be supplemented by a capacitor circuit and/or a resistor circuit.

Figure 7:
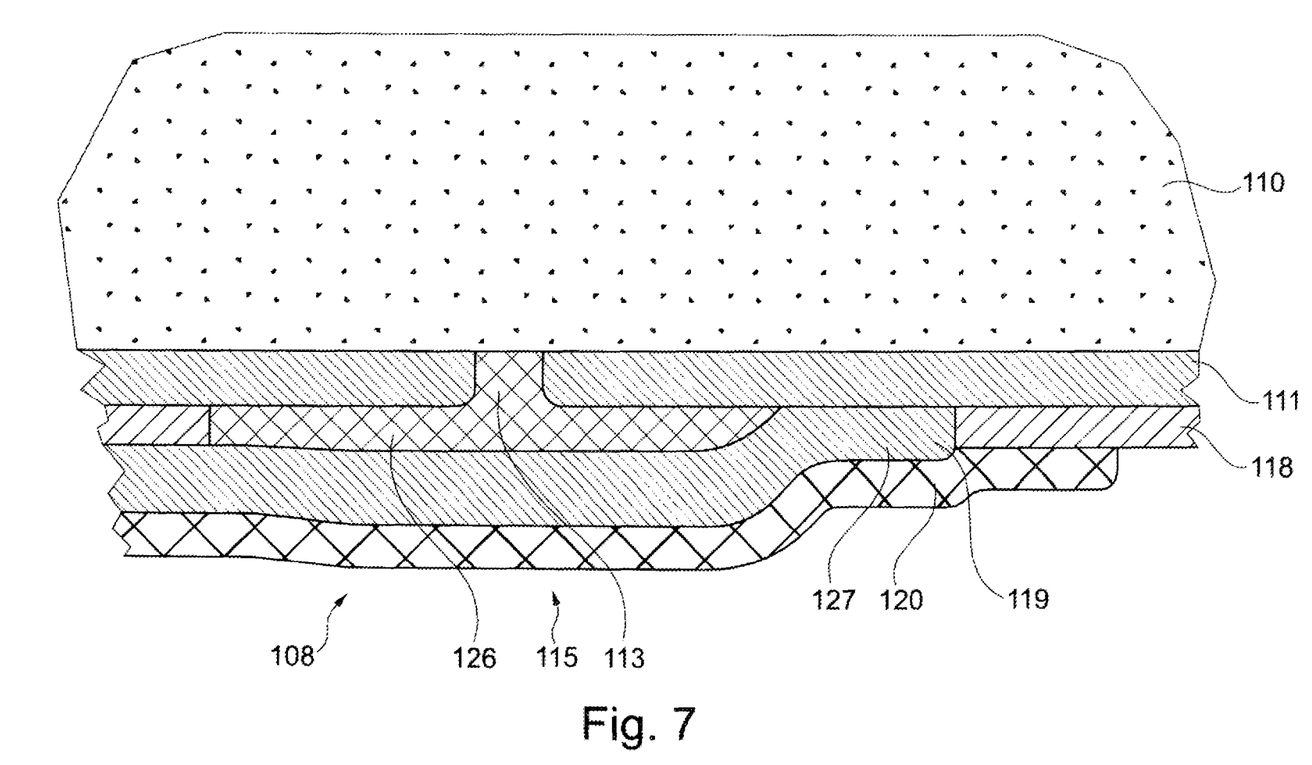
FIG. 7 shows a schematic illustration of an enlarged section of a third embodiment of a high-voltage cable embodied as a capacitor.

FIG. 7 shows an enlarged schematic illustration of the second end 115 of the first section 108 of the high-voltage cable 101. FIG. 7 is based on FIG. 5. Identical components are provided with identical reference signs. A shapeable insulation 126 is arranged in the second region 113, said insulation completely filling the second region 113 and adjoining the first insulation 110. Furthermore, the shapeable insulation 126 adjoins the first shield 111, the second shield 119 and the first sheathing 118. The second shield 119 is bent in an S-shape manner at its first end 127 in such a way that the first end 127 of the second shield 119 bears against the first shield 111. Consequently, the first shield 111 and the second shield 119 touch one another. They are therefore electrically connected to one another. The electrical contact can also be produced differently, for example using a cable connection. The second sheathing 120 is led in such a way that it bears against the first sheathing 118 and is then led over the second shield 119. This embodiment has the advantage that high field strengths cannot arise at the transition locations of the individual components.

Figure 8:
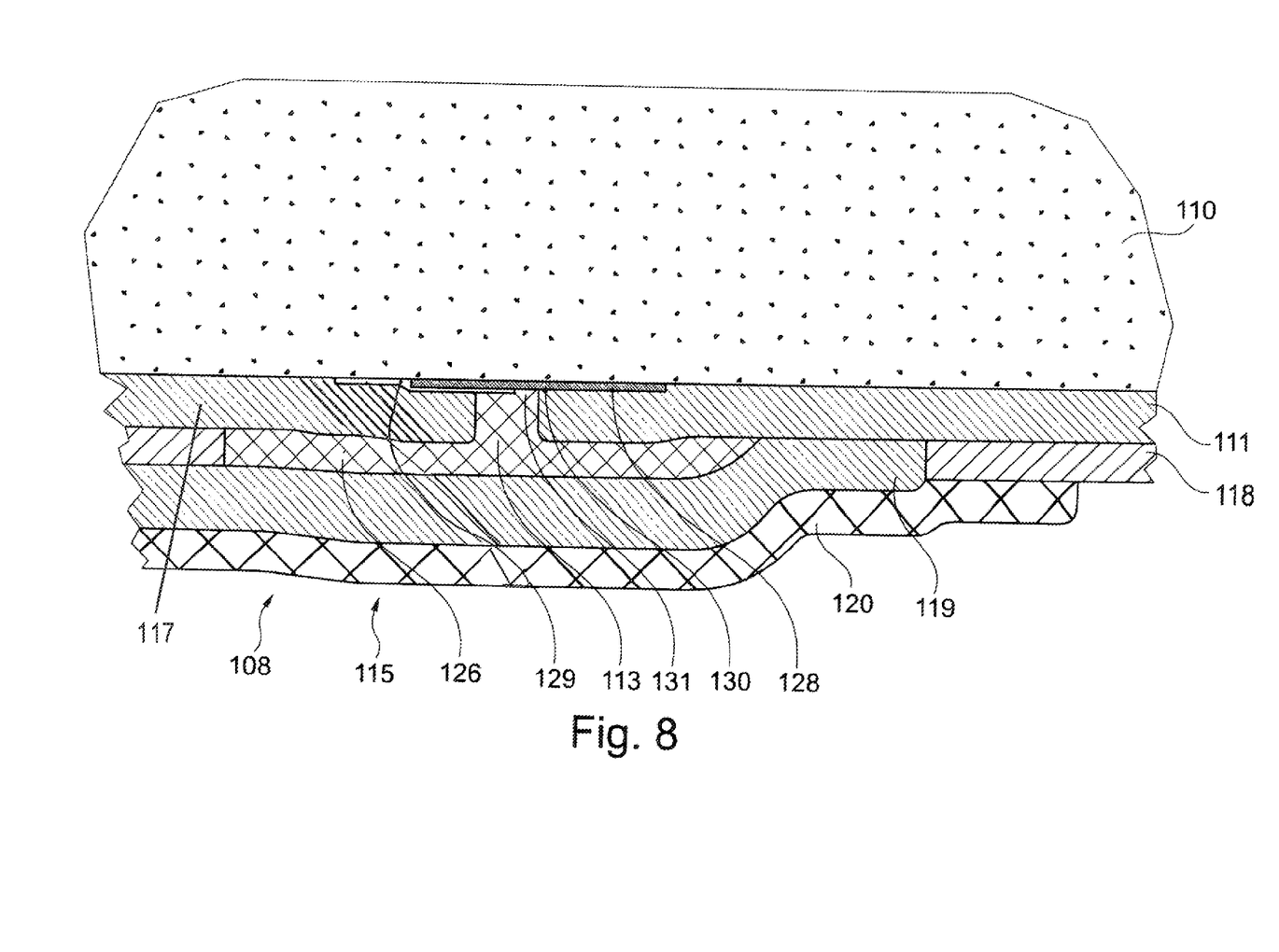
FIG. 8 shows a schematic illustration of an enlarged section of a fourth embodiment of a high-voltage cable embodied as a capacitor.

FIG. 8 shows a further enlarged schematic illustration of the second end 115 of the first section 108 of the high-voltage cable 101. The exemplary embodiment in FIG. 8 is based on FIG. 7. Identical components are provided with identical reference signs. In contrast to the exemplary embodiment in FIG. 7, in the exemplary embodiment in FIG. 8, the first shield 111 and that part 117 of the first shield 111 which is arranged between the first region 112 and the second region 113 have a cutout 130 in the boundary region between the first shield 111 and the first insulation 110 and also between the part 117 of the first shield 111 and the first insulation 110. A conductive layer 128 is formed in the cutout 130 in the region of the first shield 111, said conductive layer touching a lug 131 of the shapeable insulation 126 and extending as far as the cutout 130 along the part 117 of the first shield 111. Furthermore, at the part 117 of the first shield 111 in the cutout 130, an insulating layer 129 is additionally arranged, which partly covers the conductive layer 128 and likewise adjoins the lug 131 of the shapeable insulation 126. This ensures that the part 117 of the first shield 111 is furthermore insulated from the first shield 111. In this embodiment, the transition locations are made narrower, that is to say arranged close to one another. This embodiment also has the advantage that high field strengths cannot arise at the transition locations of the individual components.

It is pointed out that the embodiment illustrated in FIG. 8 is not restricted to the illustrated arrangement of the conductive layer 128 and of the insulating layer 129. Rather, any desired arrangement of the conductive layer 128 and of the insulating layer 129 can be provided. By way of example, the conductive layer 128 and the insulating layer 129 can be embodied in mirror-inverted fashion with respect to the arrangement as illustrated in FIG. 8.

The embodiments illustrated in FIGS. 8 and 7 can also be provided for the first region 112 of the first section 108.

Figure 9:
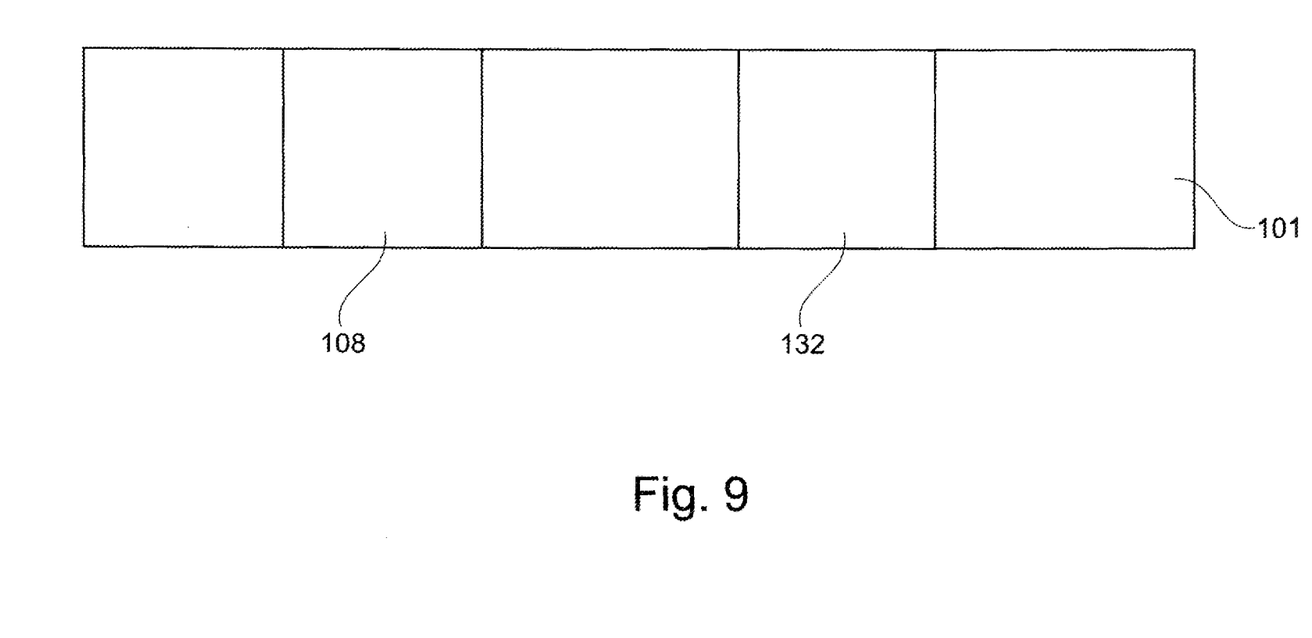
FIG. 9 shows a schematic illustration of a high-voltage cable having two first capacitors.

In an embodiment illustrated in FIG. 9, the first section 108 and a second section 132 are arranged on the high-voltage cable 101, wherein the second section 132 can be embodied structurally identically to the first section 108. Both the first section 108 and the second section 132 in each case form a first capacitor (high-voltage capacitor). They can in each case be utilized for high-voltage measurement and for regulation and stabilization of the high-voltage supply unit 100 (cf. FIG. 4).

The system described herein is based on the surprising insight that the high-voltage cable 101 of the high-voltage supply unit 100 can be used as a capacitor. The high-voltage cable 101 itself has a capacitance per unit length. Given a suitable choice of the length of the first section 108 and/or of the second section 132 of the high-voltage cable 101, the first capacitor has a capacitance that suffices for measuring the high voltage.

Various embodiments discussed herein may be combined with each other in appropriate combinations in connection with the system described herein. Additionally, in some instances, the order of steps in the flowcharts, flow diagrams and/or described flow processing may be modified, where appropriate. Further, various aspects of the system described herein may be implemented using software, hardware, a combination of software and hardware and/or other computer-implemented modules or devices having the described features and performing the described functions. Software implementations of the system described herein may include executable code that is stored in a computer readable medium and executed by one or more processors. The computer readable medium may include volatile memory and/or non-volatile memory, and may include, for example, a computer hard drive, ROM, RAM, flash memory, portable computer storage media such as a CD-ROM, a DVD-ROM, a flash drive and/or other drive with, for example, a universal serial bus (USB) interface, and/or any other appropriate tangible or non-transitory computer readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A high-voltage supply unit for a particle beam device, comprising:
   at least one high-voltage cable for feeding a high voltage; and
   at least one measuring device for measuring the high voltage, wherein the measuring device has at least one first capacitor, wherein the first capacitor is formed by at least one first section of the high-voltage cable, wherein the high-voltage cable has at least one internal conductor, wherein the internal conductor is surrounded by at least one first insulation, wherein the first insulation is surrounded by at least one first shield, wherein the at least one first shield is interrupted in at least one of: a first region or a second region of the first section of the high-voltage voltage cable, wherein the first section of the high-voltage cable is surrounded by at least one second shield, and wherein both the at least one first shield and the at least one second shield serve to protect persons working with the high-voltage supply unit.

2. The high-voltage supply unit according to claim 1, wherein the first section of the high-voltage cable extends along a longitudinal axis of the high-voltage cable and has a first longitudinal extent, and wherein at least one of the following is provided:
   (i) the first region extends along the longitudinal axis of the high-voltage cable with a second longitudinal extent, wherein the second longitudinal extent of the first region is less than the first longitudinal extent of the first section of the high-voltage cable, or
   (ii) the second region extends along the longitudinal axis of the high-voltage cable with a third longitudinal extent, wherein the third longitudinal extent of the second region is less than the first longitudinal extent of the first section of the high-voltage cable.

3. The high-voltage supply unit according to claim 1, wherein the internal conductor is surrounded by at least one second insulation, and wherein the second insulation is surrounded by at least one third shield.

4. The high-voltage supply unit according to claim 1, wherein the high-voltage supply unit has at least one of the following features:
   (i) the first shield is surrounded by at least one first sheathing, or
   (ii) in the first section of the high-voltage cable the second shield is surrounded by at least one second sheathing.

5. The high-voltage supply unit according to claim 1, wherein at least one of the following is provided:
   (i) the first shield is at ground potential, or
   (ii) the second shield is at ground potential.

6. The high-voltage supply unit according to claim 1, wherein the high-voltage cable has a capacitance per unit length in the range of 10 pF/m to 1000 pF/m.

7. The high-voltage supply unit according to claim 6, wherein the high-voltage cable has a capacitance per unit length in the range of 50 pF/m to 500 pF/m.

8. The high-voltage supply unit according to claim 6, wherein the high-voltage cable has a capacitance per unit length in the range of 80 pF/m to 250 pF/m.

9. The high-voltage supply unit according to claim 1, wherein the measuring device has at least one capacitive voltage divider, and wherein the capacitive voltage divider includes the first capacitor and at least one second capacitor.

10. The high-voltage supply unit according to claim 1, wherein the measuring device has at least one measuring resistor for measuring the high voltage.

11. The high-voltage supply unit according to claim 10, wherein the measuring resistor is arranged in a voltage measuring unit.

12. The high-voltage supply unit according to claim 1, wherein the high-voltage cable includes at least one second section, and wherein the first section is at a distance from the second section.

13. The high-voltage supply unit according to claim 12, wherein the second section is embodied identically to the first section.

14. A method of using a high-voltage supply unit, the high-voltage supply unit including at least one high-voltage cable for feeding a high voltage, and at least one measuring device for measuring the high voltage, wherein the measuring device has at least one first capacitor, and wherein the first capacitor is formed by at least one first section of the high-voltage cable, the method comprising at least one of:
   (i) measuring fluctuations of the high voltage using the high-voltage supply unit, or
   (ii) generating a measurement signal used for regulating the high-voltage supply unit,
   wherein the high-voltage cable has at least one internal conductor, wherein the internal conductor is surrounded by at least one first insulation, wherein the first insulation is surrounded by at least one first shield, wherein the at least one first shield is interrupted in at least one of: a first region or a second region of the first section of the high-voltage cable, wherein the first section of the high-voltage cable is surrounded by at least one second shield, and wherein both the at least one first shield and the at least one second shield serve to protect persons working with the high-voltage supply unit.

15. The method according to claim 14, wherein the method comprises both measuring the fluctuations of the high voltage and generating the measurement signal used for regulating the high-voltage supply unit.

16. A particle beam device, comprising:
   at least one beam generator for generating a particle beam;
   at least one objective lens for focusing the particle beam onto at least one object; and
   at least one high-voltage supply unit, the at least one high-voltage supply unit including:
      at least one high-voltage cable for feeding a high voltage; and
      at least one measuring device for measuring the high voltage, wherein the measuring device has at least one first capacitor, wherein the first capacitor is formed by at least one first section of the high-voltage cable, wherein the high-voltage cable has at least one internal conductor, wherein the internal conductor is surrounded by at least one first insulation, wherein the first insulation is surrounded by at least one first shield, wherein the at least one first shield is interrupted in at least one of: a first region or a second region of the first section of the high-voltage cable, wherein the first section of the high-voltage cable is surrounded by at least one second shield, and wherein both the at least one first shield and the at least one second shield serve to protect persons working with the high-voltage supply unit.

17. The particle beam device according to claim 16, wherein the high-voltage supply unit supplies the beam generator with high voltage.

18. The particle beam device according to claim 16, wherein the particle beam device is an electron beam device.

19. The particle beam device according to claim 16, wherein the particle beam device is an ion beam device.

20. The particle beam device according to claim 16, wherein the at least one second shield and at least a part of the at least one first shield are at ground potential.

21. The high-voltage supply unit according to claim 1, wherein the at least one second shield and at least a part of the at least one first shield are at ground potential.

22. The method according to claim 14, wherein the at least one second shield and at least a part of the at least one first shield are at ground potential.

* * * * *

UNITED STATES PATENT AND TRADEMARK OFFICE
CERTIFICATE OF CORRECTION

PATENT NO. : 8,759,800 B2
APPLICATION NO. : 13/523169
DATED : June 24, 2014
INVENTOR(S) : Joerg Fober and Martin Hugelmann It is certified that error appears in the above-identified patent and that said Letters Patent is hereby corrected as shown below:

In the specification

Column 2, lines 24, the phrase "the system described herein additionally or alternative" should read --the system described herein additionally or alternatively--.

Column 5, lines 44-47, the sentence "The objective lens 28 furthermore has pole shoes 29, in which coils are arranged." should read --The objective lens 28 furthermore has pole shoes 29, in which coils 30 are arranged.--.

In the claims

Column 9, line 27, the phrase "high-voltage voltage cable" should read --high-voltage cable--.

Column 10, line 1, the phrase "according to claim 6," should read --according to claim 7,--.

Signed and Sealed this
Third Day of November, 2015

Michelle K. Lee
*Director of the United States Patent and Trademark Office*